United States Patent
Yamamoto et al.

(10) Patent No.: US 7,928,804 B2
(45) Date of Patent: Apr. 19, 2011

(54) POWER AMPLIFIER (75) Inventors: Kazuya Yamamoto, Tokyo (JP); Satoshi Suzuki, Tokyo (JP); Takao Haruna, Tokyo (JP); Takao Moriwaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/612,755

(22) Filed: Nov. 5, 2009

(65) Prior Publication Data

US 2010/0301944 A1 Dec. 2, 2010

(30) Foreign Application Priority Data

May 26, 2009 (JP) ................................ 2009-126427

(51) Int. Cl.
H03F 3/16 (2006.01)
(52) U.S. Cl. .................... 330/300; 330/302; 330/310
(58) Field of Classification Search .................. 330/300, 330/98, 133, 277, 296, 302, 310
See application file for complete search history.

(56) References Cited

U.S. PATENT DOCUMENTS

| | | | |
|---|---|---|---|
| 5,532,650 A * | 7/1996 | Igarashi | 330/300 |
| 5,838,031 A | 11/1998 | Kobayashi et al. | |
| 6,603,351 B2 * | 8/2003 | Suzuki | 330/302 |
| 7,015,519 B2 | 3/2006 | Krutko et al. | |
| 7,098,741 B2 * | 8/2006 | Litwin et al. | 330/300 |
| 7,514,727 B2 | 4/2009 | Asano | |

FOREIGN PATENT DOCUMENTS

| | | |
|---|---|---|
| JP | 62-242419 A | 10/1987 |
| JP | 9-246877 A | 9/1997 |
| JP | 2006-228784 A | 8/2006 |
| JP | 2006-278544 A | 10/2006 |
| JP | 2007-194412 A | 8/2007 |
| JP | 2009-16597 A | 1/2009 |

* cited by examiner

*Primary Examiner* — Khanh V Nguyen
(74) *Attorney, Agent, or Firm* — Leydig, Voit & Mayer, Ltd.

(57) ABSTRACT

A power amplifier includes: a semiconductor substrate; a preceding-stage amplifying device on the semiconductor substrate, amplifying an input signal; a following-stage amplifying device on the semiconductor substrate, amplifying an output signal of the preceding-stage amplifying device; and an inter-stage matching circuit connecting the preceding-stage amplifying device to the following-stage amplifying device. The preceding-stage amplifying device has a first field effect transistor; the following-stage amplifying device has a heterojunction bipolar transistor; and the inter-stage matching circuit has a capacitance galvanically separating the output terminal of the preceding-stage amplifying device from the input terminal of the following-stage amplifying device.

4 Claims, 10 Drawing Sheets

FIG. 18

POWER AMPLIFIER

BACKGROUND OF THE INVENTION

1. Field of the Invention

The present invention relates to a power amplifier formed by a BiFET process and, more particularly, to a power amplifier capable of realizing equivalent power characteristics of a HBT (Heterojunction Bipolar Transistor) power amplifier while obtaining low noise characteristics.

2. Background Art

GaAs-FET (Field Effect Transistor) power amplifiers have a negative threshold voltage and, therefore, have a drawback of requiring a negative gate bias voltage. In contrast, GaAs-HBT (Heterojunction Bipolar Transistor) power amplifiers require no negative gate bias voltage, being capable of single power supply operation and having more uniform device characteristics in comparison with FET power amplifiers. For this reason, use of GaAs-HBT power amplifiers in CDMA (Code Division Multiple Access) portable telephones, wireless LAN (Local Area Network) devices, etc., has been markedly increased.

A BiFET process for making a FET together with a HBT on a single substrate has recently been applied to products. Ordinarily, in a GaAs BiFET process, an HBT and a depletion mode FET (that is normally on) are mounted on a single substrate. Further, a process in which an enhancement mode FET (that is normally off) is made in addition to an HBT and a depletion mode FET on a single substrate has recently been reported in a learned society (IEEE: Radio Frequency Integrated Circuits Symposium 2008).

SUMMARY OF THE INVENTION

Figure 13:
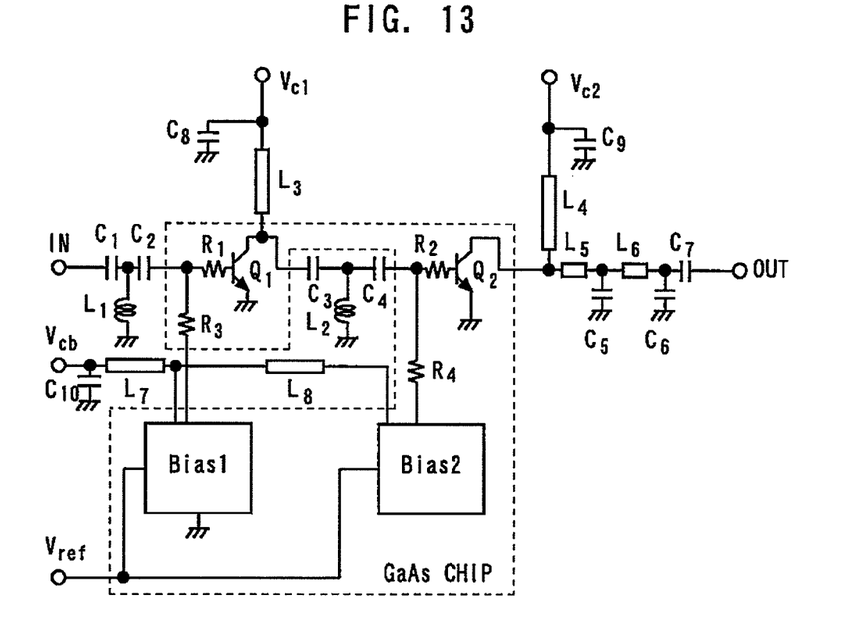
FIG. 13 is a circuit diagram showing an HBT power amplifier.

FIG. 13 is a circuit diagram showing an HBT power amplifier. This power amplifier is a two-stage amplifier. A preceding-stage amplifying device Q1 and a following-stage amplifying device Q2 are HBTs. Bias1 and Bias2 denote bias circuits for respectively supplying bias currents to the bases of the Q1 and Q2. IN denotes an RF signal input terminal. OUT denotes an RF signal output terminal. R1 to R4 denote resistors. C1 to C10 denote capacitors. L1 and L2 denote inductors. L3 to L8 denote lines having particular electrical lengths and functioning as inductors. Vc1 and Vc2 respectively denote power terminals of Q1 and Q2. Vcb denotes a power terminal of Bias1 and Bias2. Vref denotes a terminal to which a reference voltage for Bias1 and Bias 2 is externally supplied.

Figure 14:
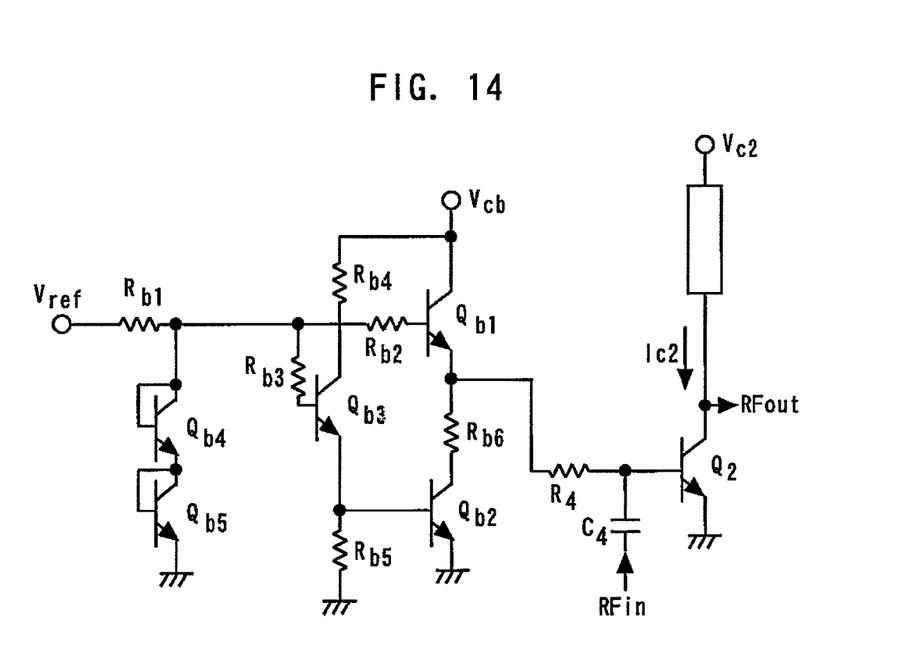
FIG. 14 is a circuit diagram showing a following-stage amplifying device and a following-stage bias circuit.

FIG. 14 is a circuit diagram showing a following-stage amplifying device and a following-stage bias circuit. Qb1 to Qb5 denote GaAs-HBTs. Rb1 to Rb6 denote resistors. The following-stage bias circuit Bias2 is an emitter follower circuit and supplies to a base of the Q2 a voltage according to the reference voltage. An RF signal input from a terminal RFin is inputted to the base of Q2 via C4 of an input matching circuit. The amplified RF signals are outputted from the collector of the Q2 to the terminal RFout. The Bias2 operates so as to constantly maintain the idling current Ictq2 through Q2 (the bias current when no RF signal is inputted) under varying temperature. The circuit configurations of the preceding-stage amplifying device Q1 and the preceding-stage bias circuit Bias1 are also the same.

Figure 15:
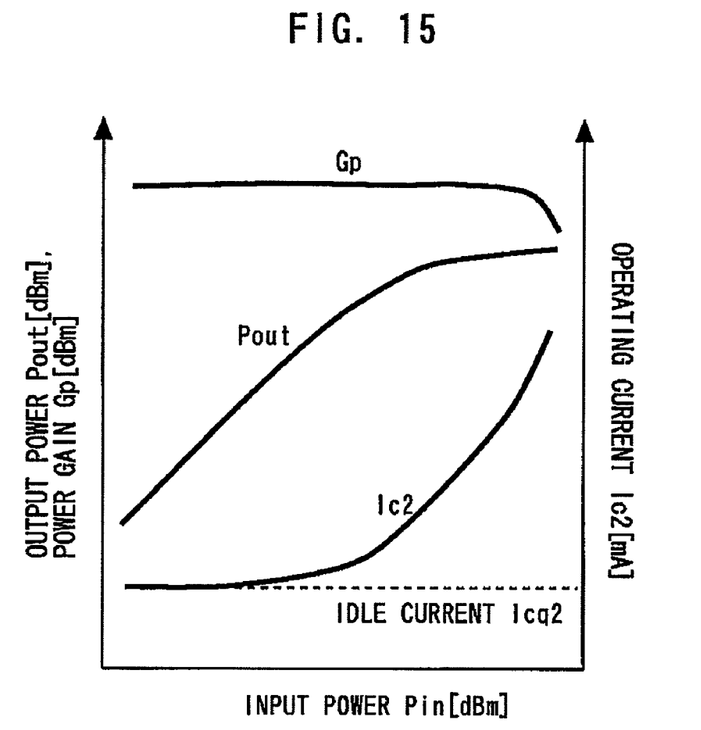
FIG. 15 is a diagram showing the input-output characteristics of the power amplifier shown in FIG. 13.

FIG. 15 is a diagram showing the input-output characteristics of the power amplifier shown in FIG. 13. IF the input power Pin increases, the idle current Ictq2 is constant but the output power Pout and the corrector current Ic2 increase. From the fact that the power gain Gp is substantially constant, it is known that the power amplifier can distortion-freely and linearly amplify signals such as W-CDMA wherein the amplitude of the modulating signals are instantly significantly varied.

Figure 16:
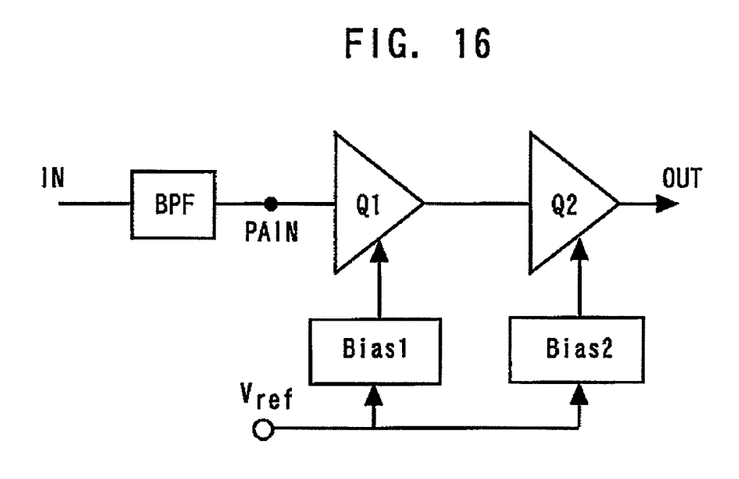
FIG. 16 is a block diagram showing a W/N (wide band/narrow band)-CDMA terminal machine which uses HBT power amplifiers.

FIG. 16 is a block diagram showing a W/N (wide band/narrow band)-CDMA terminal machine which uses HBT power amplifiers. A BPF (Band-Pass Filter) provided in a stage before the power amplifier removes noise signals other than the output signal band of the RF/IF-LSI.

Figure 17:
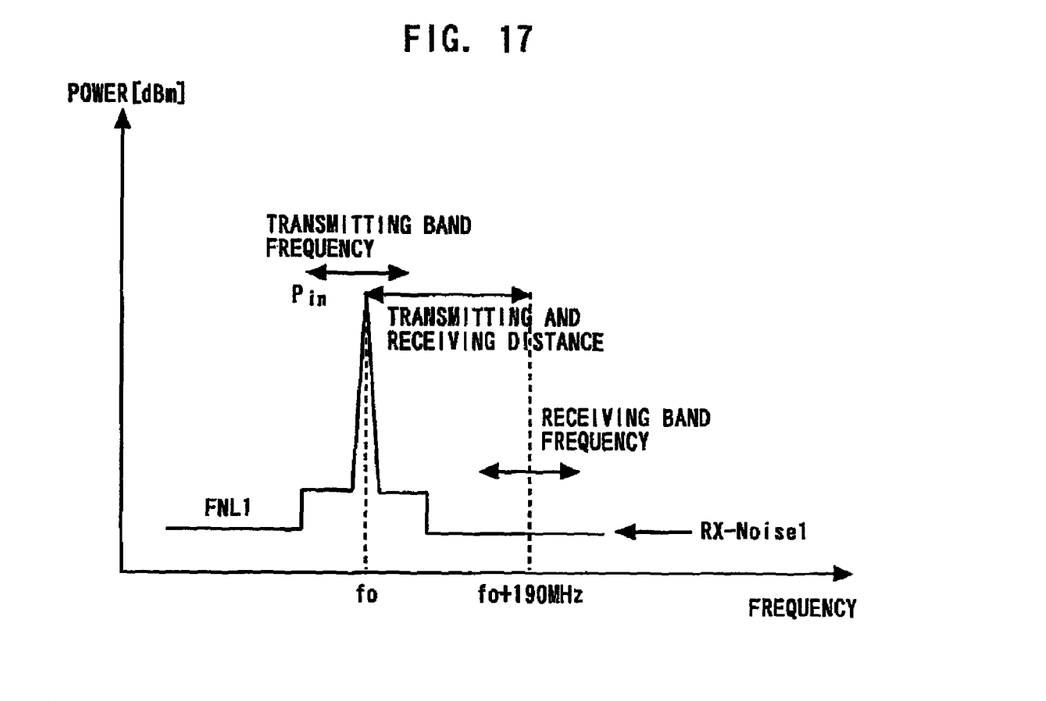
FIG. 17 is a diagram showing a spectrum waveform at the terminal PAIN shown in FIG. 16.
Figure 18:
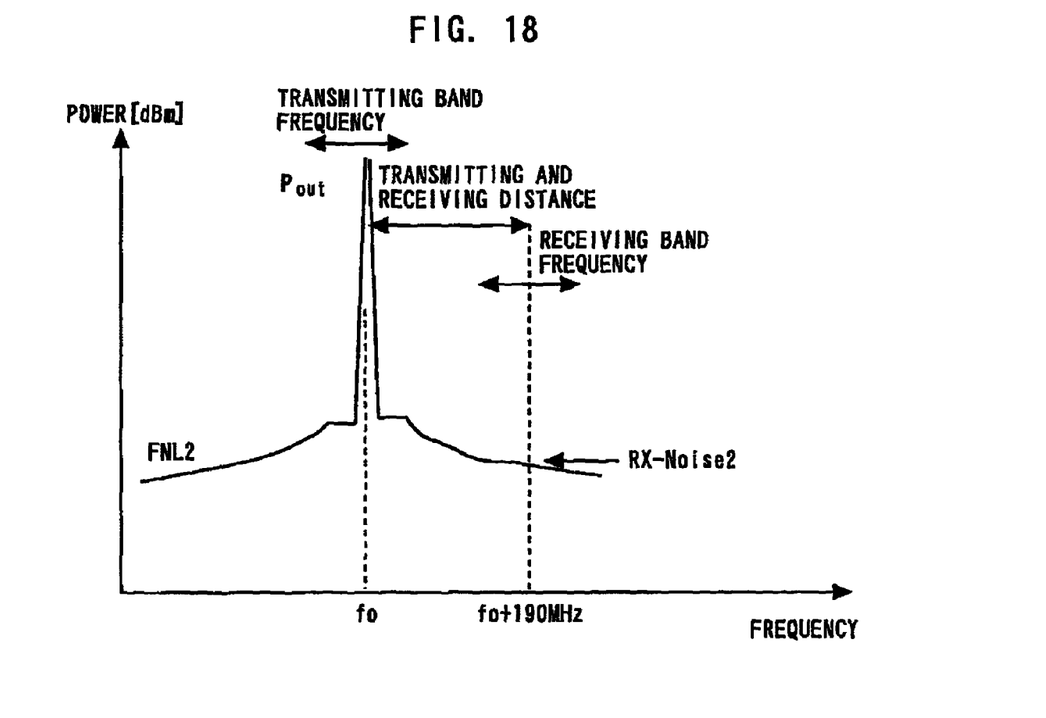
FIG. 18 is a diagram showing a spectrum waveform at the terminal OUT shown in FIG. 16.

FIG. 17 is a diagram showing a spectrum waveform at the terminal PAIN shown in FIG. 16. FIG. 18 is a diagram showing a spectrum waveform at the terminal OUT shown in FIG. 16. Here, Band1 (having a transmitting band frequency of 1920 to 1980 MHz and a receiving band frequency of 2100 to 2160 MHz) of W-CDMA is used as an example. The receiving channel for a transmitting signal of 1950 MHz is 2130 MHz. However, as shown in FIG. 17, the noise level of the receiving band frequency at the terminal PAIN is reduced to the noise level of the natural world (−174 dBm/Hz) by the BPF. If this signal is provided to the power amplifier, the signals in the transmitting band frequency and the receiving band frequency are substantially uniformly amplified, and a main signal fo is amplified from Pin to Pout. In this case, the frequency characteristics of the power gain of the power amplifier are almost uniform near fo, thereby noise in the receiving band frequency is also amplified so as to obtain the substantially same gain as the gain obtained near fo. The main signal fo is modulated, thereby the wave form has fat tail as shown in FIG. 18.

If the power amplifier performs amplifying operations, noise near DC is mixed with the second harmonic of the power amplifier, thereby being up-converted to the neighborhood of the main signal fo. This is added to the noise of the receiving band frequency. As a result, as shown in FIG. 18, the noise of the receiving band frequency increases. Several tens of dB of this noise in the receiving band frequency is suppressed by a duplexer (a filter which divides the transmitting band frequency and the receiving band frequency) provided in the subsequent stage of the power amplifier. However, the leaked noise is directly inputted to the low noise amplifier in the receiver so as to deteriorate the receive sensitivity. In the W-CDMA terminal machine, the receiving band frequency noise level of the output of the power amplifier is required to be suppressed to about −135 to −140 dBm/Hz.

In general, the following ways are effective in reducing noise in the receiving band frequency during the power amplifying operation: (i) reducing the gain of the power amplifier; (ii) reducing the noise figure (NF) of the power amplifier in the receiving band frequency; (iii) suppressing the upconversion amount of DC noise; and (iv) reducing noise flowed from the bias circuit into the amplification stage of the HBT amplifier.

However large shot noise is generated in HBTs when carriers transport across pn junctions. Therefore, the HBTs have larger noise figures in comparison with FETs such as MOSFETs (Metal Oxide Semiconductor FETs) and HEMTs (High Electron Mobility Transistors). As a result, the HBT power amplifiers generally have higher receiving band frequency noise in comparison with the FET power amplifiers having same gains and same output powers. However, in comparison with the FETs, the HBTs can be fabricated at high yield, and have high power densities. Therefore, the chip size of the HBTs can be reduced if their output levels are not influenced by the heat. As a result, the HBT power amplifiers are presently used in many portable terminals.

In view of the above-described problem, an object of the present invention is to provide a power amplifier capable of realizing equivalent power characteristics of a HBT power amplifier and obtaining low noise characteristics.

According to one aspect of the present invention, a power amplifier includes: a semiconductor substrate; a preceding-stage amplifying device on the semiconductor substrate, amplifying an input signal; a following-stage amplifying device on the semiconductor substrate, amplifying an output signal of the preceding-stage amplifying device; a preceding-stage bias circuit supplying bias currents to an input terminal of the preceding-stage amplifying device; a following-stage bias circuit supplying bias currents to an input terminal of the following-stage amplifying device; and an inter-stage matching circuit connected between an output terminal of the preceding-stage amplifying device and the input terminal of the following-stage amplifying device; wherein the preceding-stage amplifying device has a first field effect transistor of enhancement mode or a depletion mode; the following-stage amplifying device has a heterojunction bipolar transistor; and the inter-stage matching circuit has a capacitor which galvanically divides the output terminal of the preceding-stage amplifying device and the input terminal of the following-stage amplifying device.

The present invention makes it possible to realize equivalent power characteristics of a HBT power amplifier and have low noise characteristics.

Other and further objects, features and advantages of the invention will appear more fully from the following description.

DETAILED DESCRIPTION OF THE PREFERRED EMBODIMENTS

First Embodiment

Figure 1:
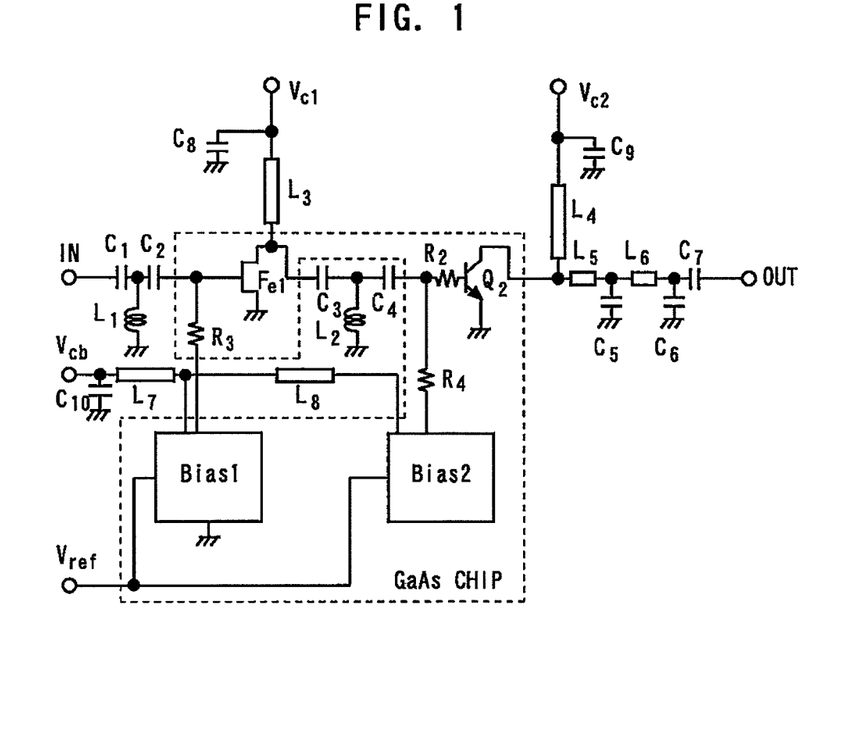
FIG. 1 is a circuit diagram showing a power amplifier according to the first embodiment.

FIG. 1 is a circuit diagram showing a power amplifier according to the first embodiment. This power amplifier is a two-stage amplifier formed by a BiFET process for making a FET together with HBTs on a single substrate.

The area within the dotted-line frame is a GaAs chip, and other circuit elements are composed of chip parts and wirings formed on a module substrate. A preceding-stage amplifying device Fe1 which amplifies an input signal and a following-stage amplifying device Q2 which amplifies an output signal of Fe1 are formed on a single GaAs substrate. Fe1 denotes an enhancement mode FET (HEMT). Q2 denotes a HBT.

Bias1 denotes a preceding-stage bias circuit which provides bias currents to the gate of Fe1. Bias2 denotes a following-stage bias circuit which provides bias currents to the base of Q2. The circuit configuration of Bias2 is same as the circuit configuration shown in FIG. 14. IN denotes a RF signal input terminal. OUT denotes a RF signal output terminal. R2 to R4 denote resistors. C1 to C10 denote capacitors. L1 and L2 denote inductors. L3 to L8 denote lines having particular electrical lengths and functioning as inductors. Vc1 denotes a power terminal of Fe1. Vc2 denotes a power terminal of Q2. Vcb denotes power terminals of Bias1 and Bias2. Vref denotes a terminal to which a reference voltage for Bias1 and Bias 2 is externally supplied. In many cases the reference voltage for HBT is about 2.8 to 2.9 V.

C3, C4, and L2 form an inter-stage matching circuit connected between the drain of Fe1 and the base of Q2. Nowadays, in many cases, C1, C2, and L1 acting as an input matching circuit and C3, C4, and L2 acting as the inter-stage matching circuit are also integrated on the GaAs chip.

Figure 2:
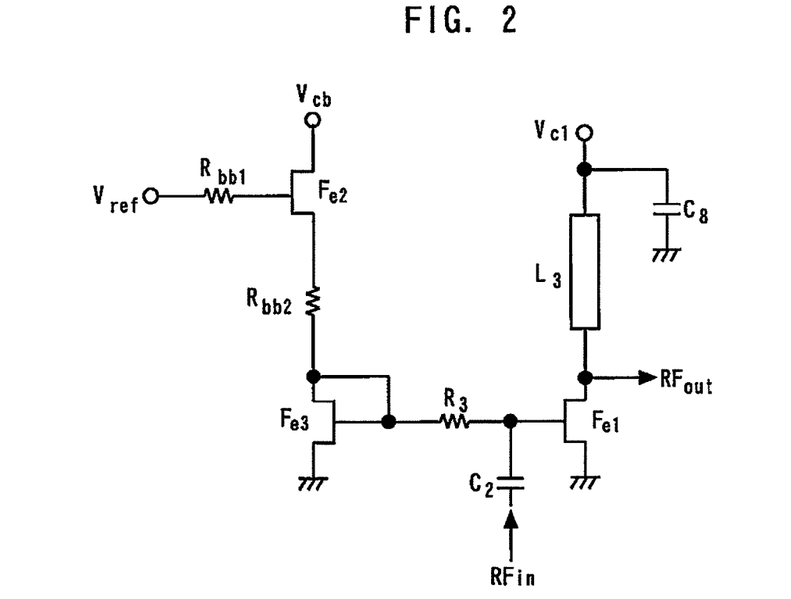
FIG. 2 is a circuit diagram showing a preceding-stage amplifying device and a preceding-stage bias circuit according to the first embodiment.

FIG. 2 is a circuit diagram showing a preceding-stage amplifying device and a preceding-stage bias circuit according to the first embodiment. Fe2 and Fe3 denote enhancement mode FETs. Rbb1 and Rbb2 denote resistors. The gate of Fe2 is connected to Terminal Vref via Rbb1. A reference voltage is supplied to the gate of Fe2. The drain of Fe2 is connected to a power supply via the terminal Vcb. The source of Fe3 is grounded. The gate and drain of Fe3 is connected to the source of Fe2 via Rbb2 and to the gate of Fe1 via R3.

Figure 3:
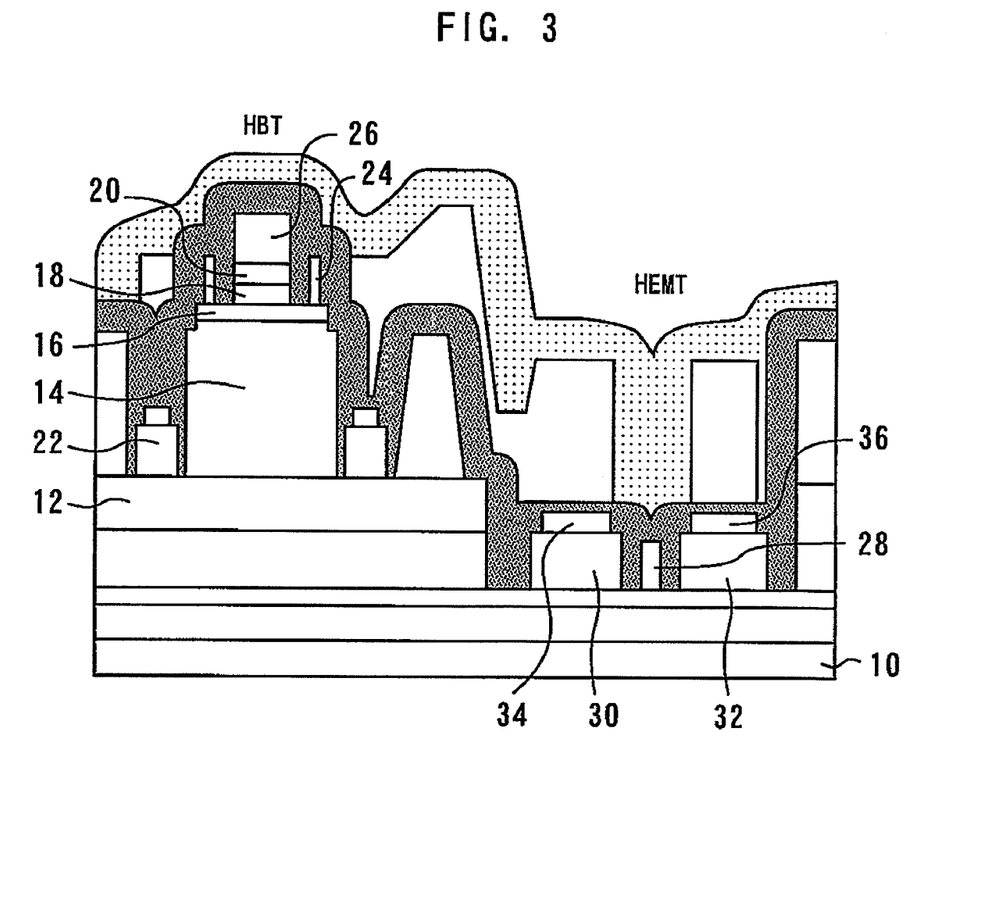
FIG. 3 is a sectional view showing a power amplifier according to the first embodiment.

FIG. 3 is a sectional view showing a power amplifier according to the first embodiment. The HBT acting as the preceding-stage amplifying device and the HEMT acting as a following-stage amplifying device are formed on the single GaAs substrate 10. The HBT includes a sub-collector layer 12, a collector layer 14, a base layer 16, an emitter layer 18, and an emitter contact layer 20 that are sequentially formed on the GaAs substrate 10; a collector electrode 22 connected to the sub-collector layer 12; a base electrode connected to the base layer 16; and an emitter electrode 26 connected to the emitter contact layer 20. The HEMT includes a gate electrode 28; a source layer 30 and a drain layer 32 arranged on both sides of the gate electrode 28; a source electrode 34 connected to the source layer 30; and a drain electrode 36 connected to the drain layer 32.

As described above, in this embodiment, an enhancement mode FET (HEMT) which has preferable noise characteristics is used as a preceding-stage amplifying device, and a HBT which has a high power density is used as a following-stage amplifying device. Thereby, equivalent power characteristics (an output power, a power gain, efficiency, and distortions) of the HBT power amplifier shown in FIG. 13, which has HBTs as the preceding-stage and following-stage amplifying devices, can be realized and low noise characteristics which are features of the HEMT can be obtained.

For example, in the case of the preceding-stage amplifying device (HBT) and the preceding-stage bias circuit as shown in FIG. 13, the noise figure in the 2 GHz band is about 4 dB or more (Only the HBT has the noise figure of 2 dB or more). On the other hand, in the case of the preceding-stage amplifying device (HEMT) and the preceding-stage bias circuit according to this embodiment, the noise figure in the 2 GHz band can be reduced to about 2 dB or less. As a result, the power amplifier according to this embodiment can reduce 2 dB or more receiving band frequency noise compared with the HBT power amplifier as shown in FIG. 13.

However, considering the fluctuation of manufacturing conditions, the threshold voltage of the enhancement mode HEMT needs to be about +0.15V or more so as to sufficiently suppress the leak current during the shutdown of the amplifier (to suppress the total leak current to about 10 uA or less when 3.4 V is applied to the terminals Vcb, Vc1, Vc2 and the voltage of Terminal Vref is set to 0V). In case of the GaAs HEMP, the junction of gate is a Schottky junction (occasionally a pn junction), thereby a maximum gate voltage is limited to about 0.7-0.8 V (about 1.1-1.2V in the case of the pn junction). Therefore, if the threshold voltage is too high for the suppression of excessive leak current, the effective gate voltage range (0.8-0.15 V) becomes narrower so that it is hard to obtain a large current amplitude, so that the output power of the single transistor is deficient. If the threshold value of the enhancement mode FET is set by considering this matter, the leak current can be reduced equally to the HBT power amplifier and equivalent power characteristics (output power, power gain, efficiency, and distortion) of the HBT power amplifier can be obtained.

The power amplifier according to this embodiment includes an inter-stage matching circuit comprising two capacitors, C3 and C4, which galvanically divide the drain voltage of the preceding-stage amplifying device Fe1 and the base bias voltage of the following-stage amplifying device Q2. This division is in contrast with the circuit wherein the electrode terminal of the HEMT is directly DC connected to the electrode terminal of the HBT (see, e.g., Japanese Patent Laid-Open No. 2006-278544, Japanese Patent Laid-Open No. 2007-194412, Japanese Patent Laid-Open No. 62-242419, and Japanese Patent Laid-Open No. 9-246877). Because this embodiment is aimed at a narrow band frequency amplifier for wireless communications, the input, inter-stage, and output matchings can be realized by using relatively small capacitors that are suitable for amplifying only a specific RF frequency band.

The preceding-stage bias circuit Bias1 according to this embodiment is the current mirror circuit shown in FIG. 2 and is simpler than the circuit shown in FIG. 14. Therefore, even if the HEMT which has a lower power density than that of the HBT is used as the preceding-stage amplifying device, equivalent power characteristics can be realized with the very little increase of the total chip size compared with the HBT power amplifier.

In this embodiment, as shown in FIG. 3, the sub-collector layer 12 of the HBT and the source layer 30 and the drain layer 32 of the HEMT are respectively formed in different epitaxial layers, and the HBT is formed above the HEMT. However, the source and drain layers of the HEMT and the sub-collector layer of the HBT may be formed in a common layer (see, e.g., U.S. Pat. No. 7,015,519B2). Therefore, the wafer manufacturing cost can be reduced. The HEMT may be formed on the HBT (see, e.g., Japanese Patent Laid-Open No. 2006-228784 and Japanese Patent Laid-Open No. 2009-16597). As a result, the gate process which needs high processing accuracy can be performed in the flat situation (the situation including few differences in level on the wafer surface).

In the bias circuit Bias1 shown in FIG. 2, an adequate capacitor may be connected between the gate (drain) of Fe2 and a ground point. Therefore, a more stable power amplifying operation can be realized.

Second Embodiment

Figure 4:
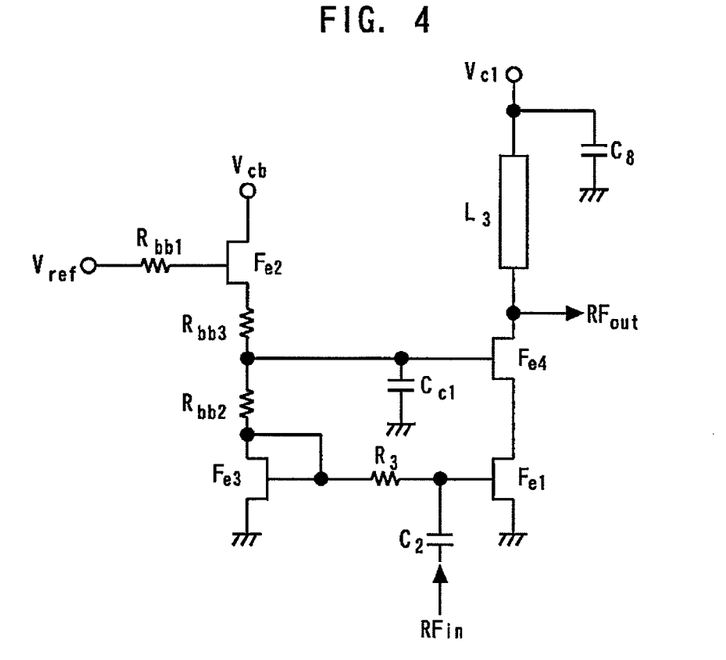
FIG. 4 is a circuit diagram showing a preceding-stage amplifying device and a preceding-stage bias circuit according to a second embodiment.

FIG. 4 is a circuit diagram showing a preceding-stage amplifying device and a preceding-stage bias circuit according to a second embodiment. Rbb3 denotes a resistance. Cc1 denotes a capacitor. Fe4 denotes an enhancement mode FET (HEMT). All other components are similar to those described in connection with the first embodiment.

The preceding-stage amplifying device has a cascode configuration which includes not only Fe1 but also F4. The source of Fe4 is connected to the drain of Fe1. As a result, the component of the preceding-stage bias circuit also differs slightly. The gate and drain of Fe3 are connected to the source of Fe2 via Rbb2 and Rbb3, are connected the gate of Fe4 via Rbb2, and are connected to the gate of Fe1 via R3. Cc1 is connected between the gate of Fe4 and a ground point.

Since the preceding-stage amplifying device is formed in a cascode configuration, a higher-gain than the first embodiment can be obtained. However, an increase in the source-drain voltage Vds by stacking FETs increases the minimum operating voltage of the drain voltage applied to the terminal Vc1. Other effects similar to those of the first embodiment can be obtained.

Third Embodiment

Figure 5:
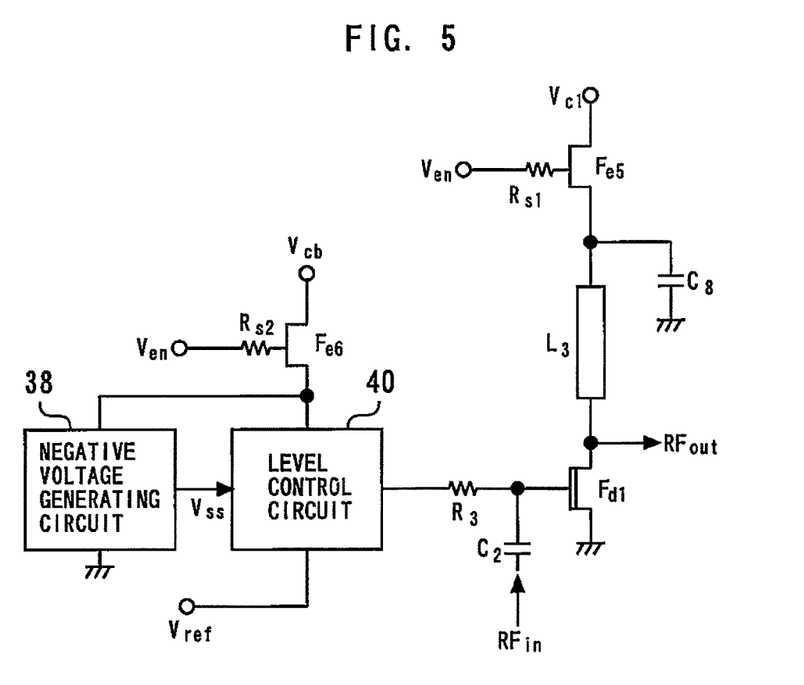
FIG. 5 is a circuit diagram showing a preceding-stage amplifying device and a preceding-stage bias circuit according to a third embodiment.

FIG. 5 is a circuit diagram showing a preceding-stage amplifying device and a preceding-stage bias circuit according to a third embodiment. Fe5 and Fe6 denote enhancement mode FETs (HEMTs). Rs1 and Rs2 denote resistors. Ven denotes an enable terminal of the circuit. 38 denotes a negative voltage generating circuit. 40 denotes a level control circuit. Fd1 denotes a depletion mode FET (HEMT). Vss denotes a generated negative voltage. All other components are similar to those described in connection with the first embodiment.

The depletion mode Fd1 is used as the preceding-stage amplifying device, instead of Fe1 according to the first embodiment. Fe5 switches whether the drain of Fd1 is connected to the terminal Vc1 (power source) or not depending on the enable signal applied to the terminal Ven.

The preceding-stage bias circuit includes a negative voltage generating circuit 38, a level control circuit 40, a Fe6, and a Rs2. The negative voltage generating circuit 38 and the level control circuit 40 are formed by a BiFET process using enhancement mode or depletion mode FETs.

Because the negative voltage needs to be generated as the gate bias voltage of the depletion mode FET Fd1, the negative voltage generating circuit 38 generates the negative voltage Vss. The level control circuit 40 converts the negative voltage Vss into a desired level in response to the reference voltage and outputs the converted negative voltage to the gate of Fd1 via R3. As a result, Fd1 is biased by a suitable idle current.

Fe6 switches whether the negative voltage generating circuit 38 and the level control circuit 40 is connected to the terminal Vcb (power source) or not depending on the enable signal applied to the terminal Ven. For example, the voltage applied to the terminal Ven is changed from 0V to Vdd, the negative voltage generating circuit 38 and the level control circuit 40 can start operating.

Figure 6:
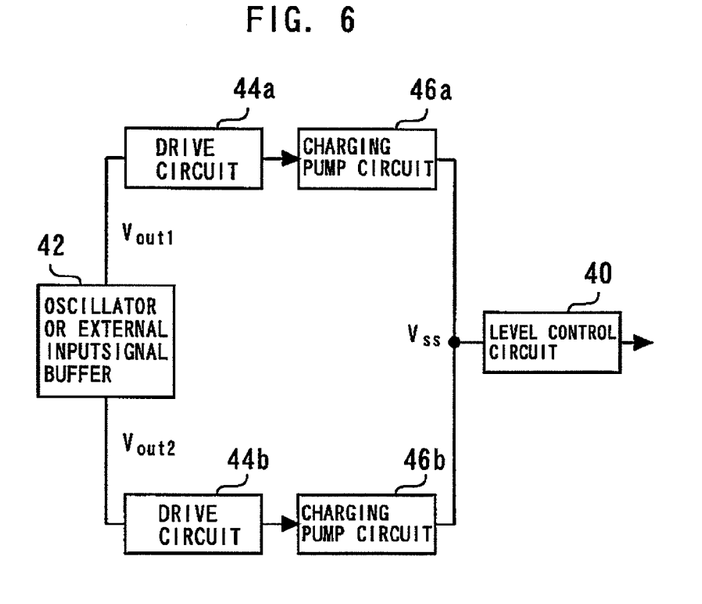
FIG. 6 is a block diagram showing a negative voltage generating circuit according to the third embodiment.

FIG. 6 is a block diagram showing a negative voltage generating circuit according to the third embodiment. 42 denotes an oscillator or an external input signal buffer. 44a and 44b denote drive circuits which amplify outputs of the oscillator or the external input signal buffer 42 to a desired voltage amplitude. 46a and 46b denote charging pump circuits. The output voltage Vout1 and Vout2 of the oscillator or the external input signal buffer 42 are in a complementarity relation. The charging pump circuits 46a, 46b operate complementarily.

Figure 7:
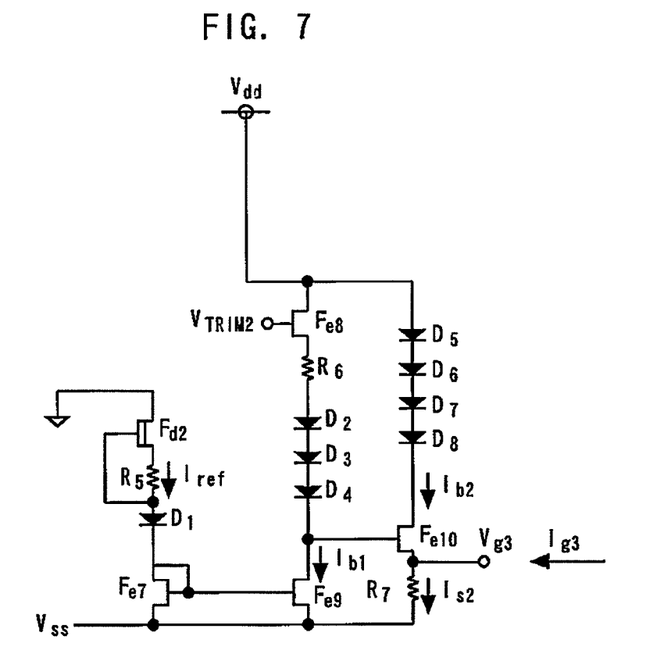
FIG. 7 is a circuit diagram showing a level control circuit which is used in the negative voltage generating circuit according to a third embodiment.

FIG. 7 is a circuit diagram showing a level control circuit which is used in the negative voltage generating circuit according to a third embodiment. Fd2 denotes a depletion mode FET (HEMT). Fe7 to Fe10 denote enhancement mode FETs (HEMTs). D1 to D8 denote diodes. R5 to R7 denote resistors. Vdd denote a power source potential. VTRIM2 denotes a reference voltage terminal. Ig3 denotes an output current (a gate current through Fd1). Ib1, Ib2, and Is2 denote branch currents of the circuit. The terminal Vg3 is connected to the gate of Fd1 via the resistor R3 as shown in FIG. 5. The level of the negative voltage outputted from the terminal Vg3 is set according to the reference voltage applied to the terminal VTRIM2.

Figure 8:
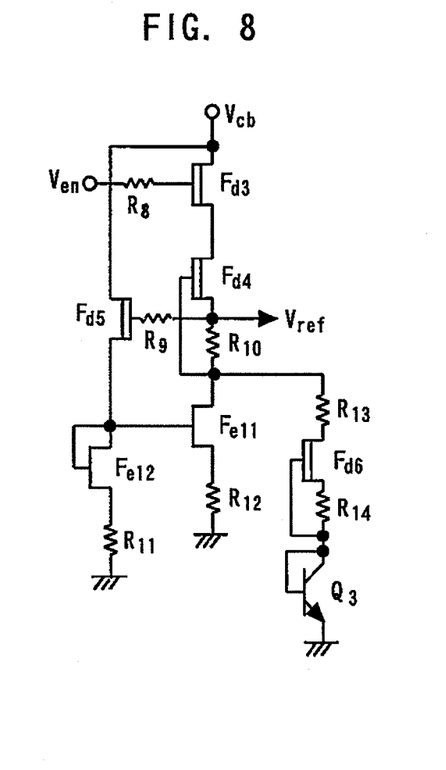
FIG. 8 is a diagram showing a reference voltage generation circuit according to the third embodiment.

FIG. 8 is a diagram showing a reference voltage generation circuit according to the third embodiment. Fd3 to Fd6 denote depletion mode FETs (HEMTs). Fe11 and Fe12 denote enhancement mode FETs (HEMTs). Q3 denotes a HBT. R8 to R14 denote resistors. This reference voltage generation circuit generates a stable reference voltage (e.g., 2.85 V) which is not related to the voltage of the terminal Vcb.

Figure 9:
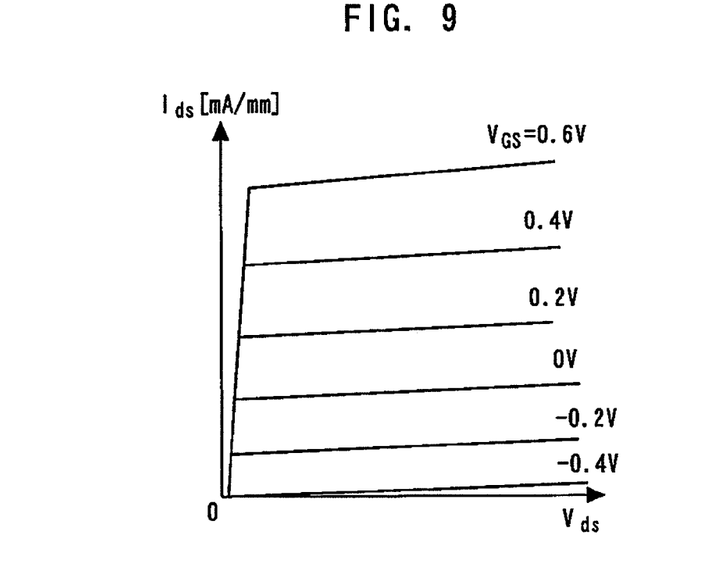
FIG. 9 is a graph showing the Ids-Vds characteristics of a depletion mode FET.
Figure 10:
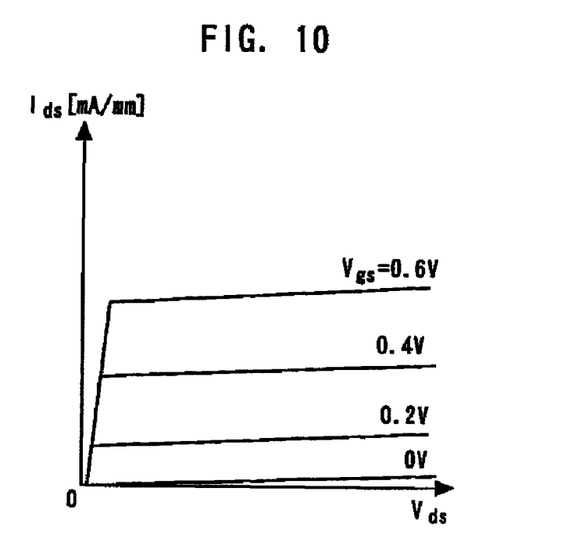
FIG. 10 is a graph showing the Ids-Vds characteristics of an enhancement mode FET.
Figure 11:
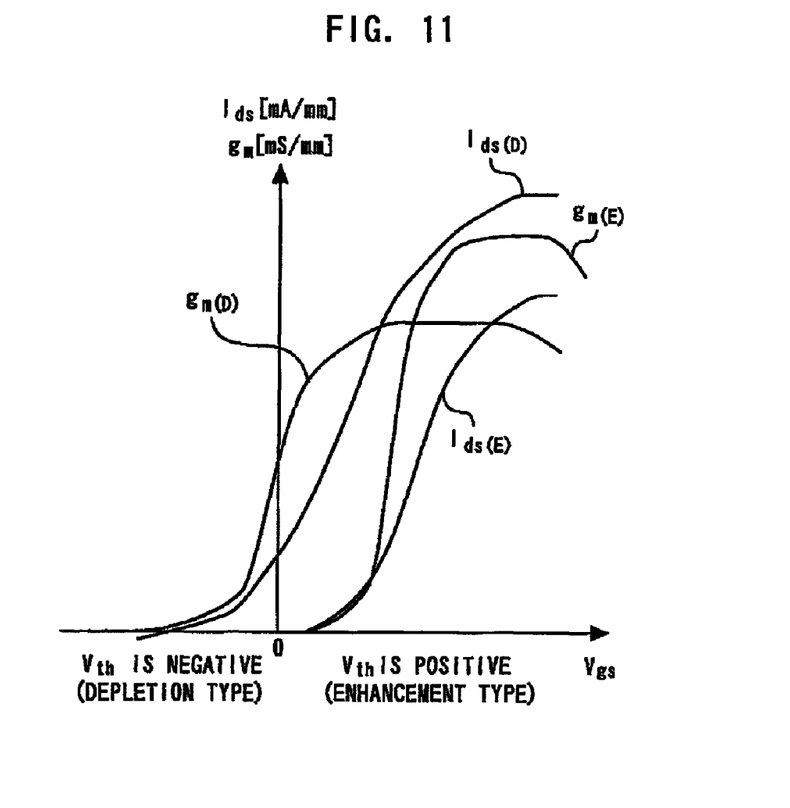
FIG. 11 is a graph showing the Ids/gm-Vgs characteristics of a depletion mode FET and an enhancement mode FET.

FIG. 9 is a graph showing the Ids-Vds characteristics of a depletion mode FET. FIG. 10 is a graph showing the Ids-Vds characteristics of an enhancement mode FET. FIG. 11 is a graph showing the Ids/gm-Vgs characteristics of a depletion mode FET and an enhancement mode FET. From these figures, it is known that the depletion mode FET can obtain the higher current density per unit gate width than that of the enhancement mode FET. In this embodiment, the depletion mode FET is used as the preceding-stage amplifying device, thereby the gate width of the preceding-stage amplifying device can be smaller than those of the circuits according to the first and second embodiments. However, the enhancement mode FET generally has the higher mutual conductance gm than that of the depletion mode FET.

By the enhancement mode FETs Fe5 and Fe6, the leak current during Ven=0V (the shutdown of the amplifier) can be suppressed to that of the HBT power amplifier. Unlike the cases of the first and second embodiments, the enhancement mode FET does not perform RF amplifying operations, thereby its gate length can be longer than that of Fd1, thus the stable positive threshold voltage Vth can be realized. Other effects, which are the same as those of the first embodiment, can also be obtained.

Fourth Embodiment

Figure 12:
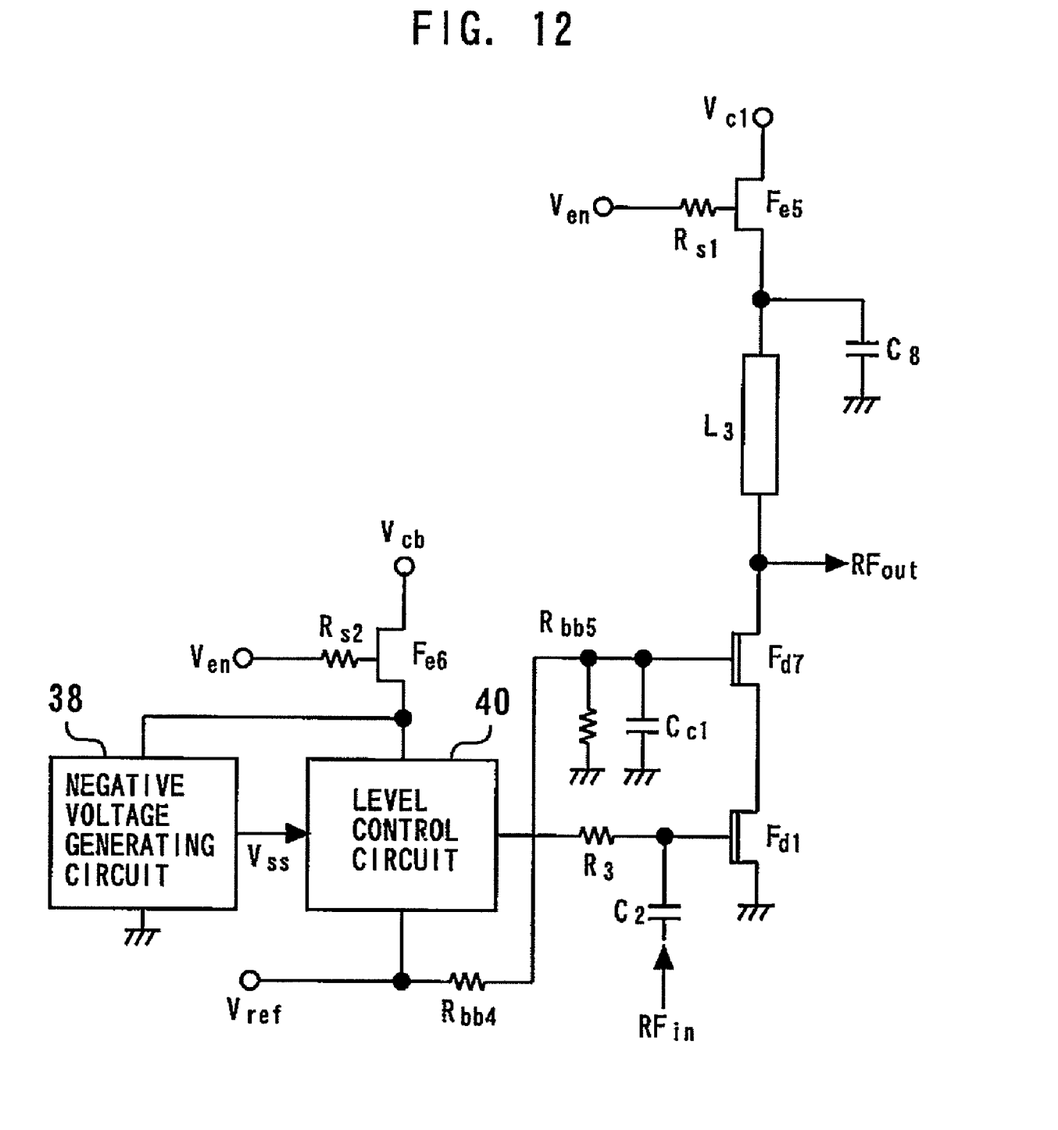
FIG. 12 is a circuit diagram showing a preceding-stage amplifying device and a preceding-stage bias circuit according to the fourth embodiment.

FIG. 12 is a circuit diagram showing a preceding-stage amplifying device and a preceding-stage bias circuit according to the fourth embodiment. Rbb4 and Rbb5 denote resistors. Cc1 denotes a capacitor. Fd7 denotes a depletion mode FET (HEMT). All other components are similar to those described in connection with the third embodiment.

The preceding-stage amplifying device has a cascode configuration including not only Fd1 but also Fd7. The source of Fd7 is connected to the drain of Fd1. Fe5 switches whether the drain of Fd7 is connected to the terminal Vc1 (power source) or not depending on the enable signal applied to the terminal Ven. The level control circuit 40 converts the negative voltage Vss into a desired level in response to the reference voltage and outputs the converted negative voltage to the gate of Fd1 via R3 and to the gate of Fd7 via Rbb4.

Since the preceding-stage amplifying device is formed in a cascode configuration, a higher-gain than the third embodiment can be obtained. However, an increase in the source-drain voltage Vds by stacking FETs increases the minimum operating voltage of the drain voltage applied to the terminal Vc1. Other effects similar to those of the third embodiment can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-126427, filed on May 26, 2009 including specification, claims, drawings and summary, on which the Convention priority of the present application is based, are incorporated herein by reference in its entirety.

What is claimed is:

1. A power amplifier comprising:
 a semiconductor substrate;
 preceding-stage amplifying device on the semiconductor substrate, amplifying an input signal;
 a following-stage amplifying device on the semiconductor substrate, amplifying an output signal of the preceding-stage amplifying device;
 a preceding-stage bias circuit supplying bias currents to an input terminal of the preceding-stage amplifying device;
 a following-stage bias circuit supplying bias currents to an input terminal of the following-stage amplifying device; and
 an inter-stage matching circuit connected between an output terminal of the preceding-stage amplifying device and the input terminal of the following-stage amplifying device, wherein
 the preceding-stage amplifying device includes a first field effect transistor, which is an enhancement mode field effect transistor including a source, a gate, and a drain,
 the following-stage amplifying device includes a heterojunction bipolar transistor,
 the inter-stage matching circuit includes a capacitance which galvanically separates the output terminal of the preceding-stage amplifying device from the input terminal of the following-stage amplifying device, and
 the preceding-stage bias circuit includes:
 a second field effect transistor that is an enhancement mode field effect transistor, having a gate through which a reference voltage is input, a drain connected to a power supply, and a source, a resistor, and
a third field effect transistor, which is an enhancement mode field effect transistor, having a source that is grounded, and a gate and a drain which are connected
to the source of the second field effect transistor via the resistor, and
to the gate of the first field effect transistor.

2. A power amplifier comprising:
a semiconductor substrate;
a preceding-stage amplifying device on the semiconductor substrate, amplifying an input signal;
a following-stage amplifying device on the semiconductor substrate, amplifying an output signal of the preceding-stage amplifying device;
a preceding-stage bias circuit supplying bias currents to an input terminal of the preceding-stage amplifying device;
a following-stage bias circuit supplying bias currents to an input terminal of the following-stage amplifying device; and
an inter-stage matching circuit connected between an output terminal of the preceding-stage amplifying device and the input terminal of the following-stage amplifying device, wherein
the preceding-stage amplifying device includes a first field effect transistor, which is an enhancement mode field effect transistor including a source, a gate, and a drain,
the following-stage amplifying device includes a heterojunction bipolar transistor,
the inter-stage matching circuit includes a capacitance which galvanically separates the output terminal of the preceding-stage amplifying device from the input terminal of the following-stage amplifying device,
the preceding-stage amplifying device includes a second field effect transistor, which is an enhancement mode field effect transistor, having a source, a gate, and a drain, the source being connected to the drain of the first field effect transistor, and
the preceding-stage bias circuit includes:
a third field effect transistor, which is an enhancement mode field effect transistor, having a gate through which a reference voltage is input, a drain connected to a power supply, and a source,
first and second resistors, and
a fourth field effect transistor, which is an enhancement mode field effect transistor, having a source that is grounded, and a gate and a drain which are connected to
the source of the third field effect transistor via the first resistor and the second resistor,
the gate of the second field effect transistor via the first resistor, and
the gate of the first field effect transistor.

3. A power amplifier comprising:
a semiconductor substrate;
a preceding-stage amplifying device on the semiconductor substrate, amplifying an input signal;
a following-stage amplifying device on the semiconductor substrate, amplifying an output signal of the preceding-stage amplifying device;
a preceding-stage bias circuit supplying bias currents to an input terminal of the preceding-stage amplifying device;
a following-stage bias circuit supplying bias currents to an input terminal of the following-stage amplifying device;

an inter-stage matching circuit connected between an output terminal of the preceding-stage amplifying device and the input terminal of the following-stage amplifying device, wherein
the preceding-stage amplifying device includes a first field effect transistor, which is a depletion mode field effect transistor including a source, a gate, and a drain,
the following-stage amplifying device includes a heterojunction bipolar transistor, and
the inter-stage matching circuit includes a capacitance which galvanically separates the output terminal of the preceding-stage amplifying device from the input terminal of the following-stage amplifying device;
a second field effect transistor, which is an enhancement mode field effect transistor, switching connection of the drain of the first field effect transistor to a power source in response to an enable signal, wherein
the preceding-stage bias circuit includes:
a negative voltage generating circuit generating a negative voltage,
a level control circuit converting the negative voltage to a desired level in response to a reference voltage and outputting the negative voltage, as converted, to the gate of the first field effect transistor, and
a third field effect transistor that is an enhancement mode field effect transistor, switching connection of the negative voltage generating circuit and the level control circuit to a power source in response to the enable signal.

4. A power amplifier comprising:
a semiconductor substrate;
a preceding-stage amplifying device on the semiconductor substrate, amplifying an input signal;
a following-stage amplifying device on the semiconductor substrate, amplifying an output signal of the preceding-stage amplifying device;
a preceding-stage bias circuit supplying bias currents to an input terminal of the preceding-stage amplifying device;
a following-stage bias circuit supplying bias currents to an input terminal of the following-stage amplifying device; and
an inter-stage matching circuit connected between an output terminal of the preceding-stage amplifying device and the input terminal of the following-stage amplifying device, wherein
the preceding-stage amplifying device includes a first field effect transistor, which is a depletion mode field effect transistor including a source, a gate, and a drain,
the following-stage amplifying device includes a heterojunction bipolar transistor,
the inter-stage matching circuit includes a capacitance which galvanically separates the output terminal of the preceding-stage amplifying device from the input terminal of the following-stage amplifying device,
the preceding-stage amplifying device further includes:
a second field effect transistor, which is a depletion mode field effect transistor, having a source connected to the drain of the first field effect transistor, and
a third field effect transistor, which is an enhancement mode field effect transistor, switching connection of the drain of the second field effect transistor to a power source in response to an enable signal; and
the preceding-stage bias circuit includes:
a negative voltage generating circuit generating a negative voltage, a level control circuit converting the negative voltage to a desired level in response to a reference voltage and outputting the negative voltage, as converted, to the gate of the first field effect transistor and the gate of the second field effect transistor, and
a fourth field effect transistor, which is an enhancement mode field effect transistor, switching connection of the negative voltage generating circuit and the level control circuit to a power source in response to the enable signal.

* * * * *